(12) United States Patent
Miyazaki

(10) Patent No.: US 6,574,027 B2
(45) Date of Patent: Jun. 3, 2003

(54) OPTICAL MODULATOR, AND OPTICAL-MODULATOR-INTERGRATED LASER DIODE

(75) Inventor: Yasunori Miyazaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 75 days.

(21) Appl. No.: 09/852,626

(22) Filed: May 11, 2001

(65) Prior Publication Data

US 2002/0057483 A1 May 16, 2002

(30) Foreign Application Priority Data

Nov. 15, 2000 (JP) .......................................... 2000-347483

(51) Int. Cl.[7] .............................. G02F 1/00; G02F 1/03; H01L 31/072; H01S 5/00
(52) U.S. Cl. ........................ 359/248; 359/321; 257/14; 372/45; 372/46
(58) Field of Search ................................ 359/321, 322, 359/246, 248, 254, 298, 240, 245, 247, 276; 257/14, 80, 96, 98, 94, 21, 184; 385/1, 2, 3, 8, 131; 376/96; 372/50, 96, 45, 46

(56) References Cited

U.S. PATENT DOCUMENTS

| | | | | | |
|---|---|---|---|---|---|
| 5,481,397 | A | * | 1/1996 | Burt ............................ | 359/298 |
| 5,488,233 | A | * | 1/1996 | Ishikawa et al. ............... | 257/94 |
| 5,594,750 | A | * | 1/1997 | Zhang et al. .................. | 372/45 |
| 5,804,842 | A | * | 9/1998 | Thio ........................... | 257/184 |
| 6,026,110 | A | * | 2/2000 | Makino ........................ | 372/96 |
| 6,066,859 | A | * | 5/2000 | Stegmueller .................. | 257/21 |
| 6,075,254 | A | * | 6/2000 | Shen et al. .................... | 257/21 |
| 6,148,017 | A | * | 11/2000 | Borchert et al. .............. | 372/50 |
| 6,151,351 | A | * | 11/2000 | Kito et al. ...................... | 372/96 |

FOREIGN PATENT DOCUMENTS

JP              6-152050            5/1994

* cited by examiner

Primary Examiner—Evelyn Lester
Assistant Examiner—Gary O'Neill
(74) Attorney, Agent, or Firm—Leydig, Voit & Mayer, Ltd.

(57) ABSTRACT

An optical modulator which is suitable for use in high-speed optical communications and simultaneously satisfies demands for incident light of higher intensity and lower chirp. An absorption layer having a multi-quantum-well structure includes a well layer having a first bandgap energy, and a barrier layer having a second bandgap energy, the second bandgap energy being greater than the first bandgap energy and no less than 0.946 eV.

8 Claims, 7 Drawing Sheets

|  | Egb (eV) | ΔEc (meV) | ΔEv (meV) | BARRIER DISTORTION (%) |
|---|---|---|---|---|
| RELATED ART | 1.051 | 96 | 129 | -0.3% |
| EMBODIMENT 1 | 0.939 | 52 | 72 | -0.3% |
| EMBODIMENT 2 | 0.939 | 60 | 63 | -0.6% |

CONTRACTION DISTORTION

OPTICAL MODULATOR, AND OPTICAL-MODULATOR-INTERGRATED LASER DIODE

BACKGROUND OF THE INVENTION

1. Field of the Invention

The present invention relates to an optical modulator and an optical-modulator-integrated laser diode, and more particularly, to an optical modulator and an optical-modulator-integrated laser diode suitable for application to high-speed optical communications.

2. Description of the Background Art

In the field of optical communications, an optical modulator having an absorption layer of quantum-well structure has hitherto been known. The absorption layer comprises a well layer involving a comparatively narrow bandgap between the valence band and the conduction band, and a barrier layer which involves a wide bandgap and is formed on either side of the well layer.

FIG. 1 is a band diagram showing an absorption layer of multiple quantum well structure having a plurality of well layers and barrier layers. In FIG. 1, Egb denotes a bandgap of the barrier layer; $\Delta Ec$ denotes a band offset between the quantum level of electrons within the well layer and the conduction band of the barrier layer; and $\Delta Ev$ denotes a band offset between the quantum level of positive holes within the well layer and the valence band of the barrier layer.

The performance of the optical modulator can be evaluated by means of, for example, an extinction ratio. Here, the extinction ratio is the ratio of the maximum intensity Imax to the minimum intensity Imin (Imax/Imin) of light emitted from an optical modulator when light of certain intensity enters the optical modulator. Alternatively, the extinction ratio may be expressed in decibels [10log (Imax/Imin)]. The extinction ratio assumes a greater value as the bandgap of the barrier layer increases. For this reason, the bandgap of the barrier layer in a related-art optical modulator is usually set to 1.05 eV or thereabouts.

The greater the bandgap of the barrier layer, the greater the chirp that is likely to arise in the optical modulator. FIG. 2 is a graph for describing the chirp-related characteristic of the related-art optical modulator. As shown in FIG. 2, the horizontal axis represents a modulator bias voltage applied to the optical modulator, and the vertical axis represents an $\alpha$ parameter expressing the level of chirp. Three lines shown in FIG. 2 respectively represent the $\alpha$ parameter obtained as a result of incident light which induces an optical current of 15 mA, the $\alpha$ parameter obtained as a result of incident light which induces an optical current of 10 mA, and the $\alpha$ parameter obtained as a result of incident light which induces an optical current of 2 mA.

As shown in FIG. 2, the $\alpha$ parameter of the optical modulator increases as the amount of resultant optical current increases; that is, as the intensity of light entering the optical modulator increases. More specifically, when the modulator bias voltage is 0V and the optical current is 2 mA, the $\alpha$ parameter assumes a value smaller than 1. When the optical current is 10 mA, the $\alpha$ parameter assumes a value of about 2. Further, when the optical current is 15 mA, the $\alpha$ parameter assumes a value of about 3.

When an optical modulator is used as the light source of an optical communications system, the $\alpha$ parameter is usually required to assume a value smaller than 1.5. The results shown in FIG. 2 demonstrate that the related-art optical modulator fails to satisfy the performance of the light source of the optical communications system in a range of incident light of high intensity. As mentioned above, the related-art optical modulator involves a problem of inability to simultaneously satisfy demands for incident light of increased intensity and for reduced chirp.

SUMMARY OF THE INVENTION

The present invention has been conceived to solve such a drawback and is primarily aimed at providing an optical modulator capable of simultaneously satisfying demand for incident light of increased intensity and demand for reduced chirp.

The present invention is also aimed at providing an optical modulator integrated diode integrally comprising the optical modulator and a laser diode.

The above objects of the present invention are achieved by an optical modulator having an absorption layer of quantum-well structure. The absorption layer includes a well layer having a first bandgap between a valence band and a conduction band. The absorption layer also includes a barrier layer having a second bandgap between a valence band and a conduction band. The second bandgap is set so as to be greater than the first bandgap and be equal to or less than 0.946 eV.

The above objects of the present invention are achieved by an optical modulator integrated laser diode. The integrated laser diode includes the optical modulator described above as well as a laser diode for causing a laser beam of predetermined wavelength to enter an absorption layer of the optical modulator.

Other objects and further features of the present invention will be apparent from the following detailed description when read in conjunction with the accompanying drawings.

DESCRIPTION OF THE PREFERRED EMBODIMENTS

Figures 3, 4:
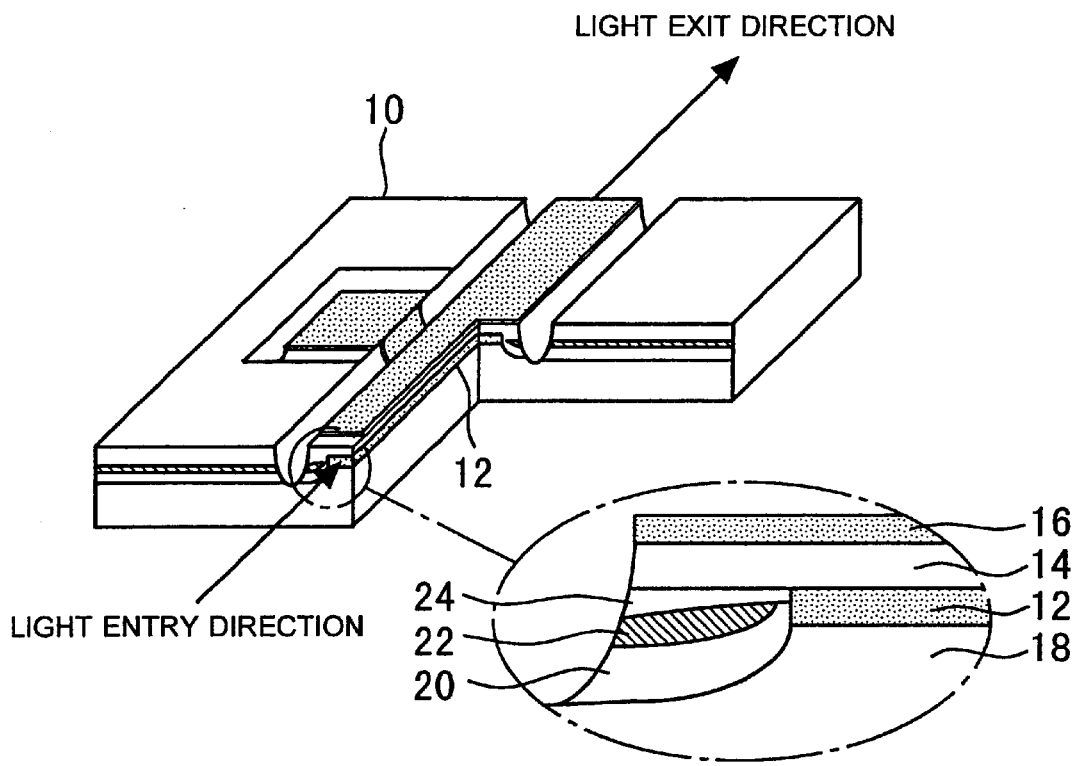
FIG. 3 is a perspective view showing an optical modulator according to a first embodiment of the present invention.
FIG. 4 is a table showing, for comparison, characteristic values of a multi-quantum-well absorption layer of the relate-art optical modulator, characteristic values of a multi-quantum-well absorption layer according to the first embodiment, and characteristic values of a multi-quantum-well absorption layer according to a second embodiment of the present invention.

Preferred embodiments of the present invention will be described by reference to the accompanying drawings. Throughout the drawings, like reference numerals designate like elements, and repetition of their explanations is omitted.
First Embodiment FIG. 3 is a perspective view showing an optical modulator according to a first embodiment of the present invention. The optical modulator 10 according to the present embodiment is a device to be used for optical communications of 1550 nm band. As shown in FIG. 3, the optical modulator 10 has a multi-quantum-well absorption layer 12. The multi-quantum-well absorption layer 12 comprises a plurality of well and barrier layers, which are stacked alternately in the vertical direction in FIG. 3. The well layer can be formed from, for example, an InGaAsP layer or an InGaAs layer. The barrier layer can be formed from an InGaAsP layer, InAlAs layer, or InGaAlAs layer. In the present embodiment, the multi-quantum-well absorption layer 12 is a multilayer film consisting of a well layer having an InGaAsP layer, and a barrier layer having an InGaAsP layer; or a multilayer film consisting of a well layer having an InGaAs layer, and a barrier layer having an InAlAs layer.

A p-InP clad layer 14 which has been controlled so as to become a p-type semiconductor is formed on the multi-quantum-well absorption layer 12. A p-InGaAs contact layer 16 of a p-type semiconductor is formed on the p-In clad layer 14. Further, an n-InP substrate 18 of an n-type semiconductor is formed below the multi-quantum-well absorption layer 12. Between the p-In clad layer 14 and the n-InP substrate 18, there are formed a semi-insulated InP current block layer 20, an n-InP current block layer 22 of an n-type semiconductor, and a semi-insulated current block layer 24, so as to cover the side of the multi-quantum-well absorption layer 12.

As shown in FIG. 3, light enters one end of the multi-quantum-well absorption layer 12 of the optical modulator 10. The majority of the thus-entered light passes through the inside of the multi-quantum-well absorption layer 12 and is emitted from the other end thereof. A negative voltage is applied to the p-InP clad layer 14 laid on the surface of the multi-quantum-well absorption layer 12, and a positive voltage is applied to the n-InP substrate 18 provided on the underside of the multi-quantum-well absorption layer 12. Consequently, the bandgap of the multi-quantum-well is made small by means of the Quantum-Confined Start Effect. As a result, the absorption coefficient of the multi-quantum-well absorption layer 12 relative to the wavelength of incident light increases. Accordingly, by means of application of an appropriate voltage to the multi-quantum-well absorption layer 12, the optical modulator 10 can arbitrarily fulfill a state in which transmission of incident light is permitted or a state in which incident light is to be interrupted.

Figure 1:
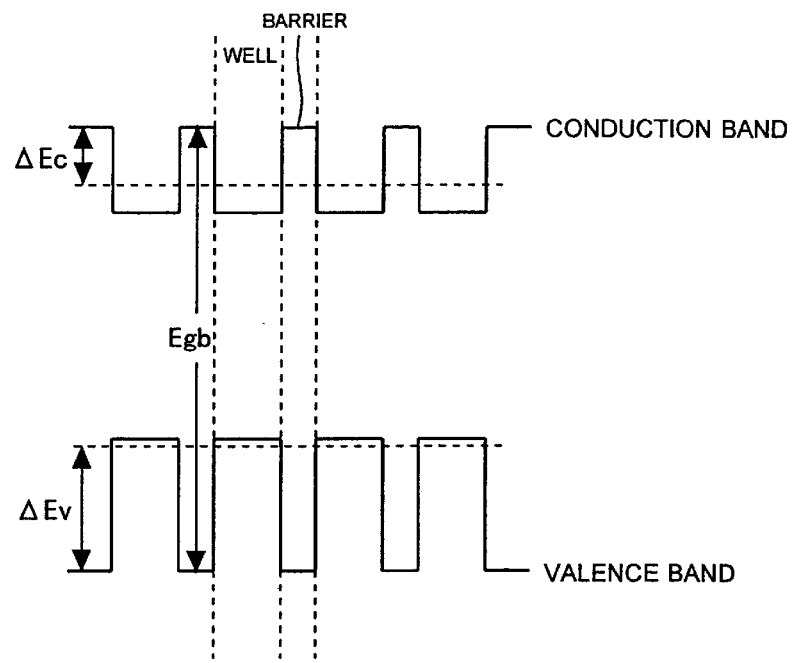
FIG. 1 is a band diagram of an absorption layer of a multiple quantum well structure.
Figure 2:
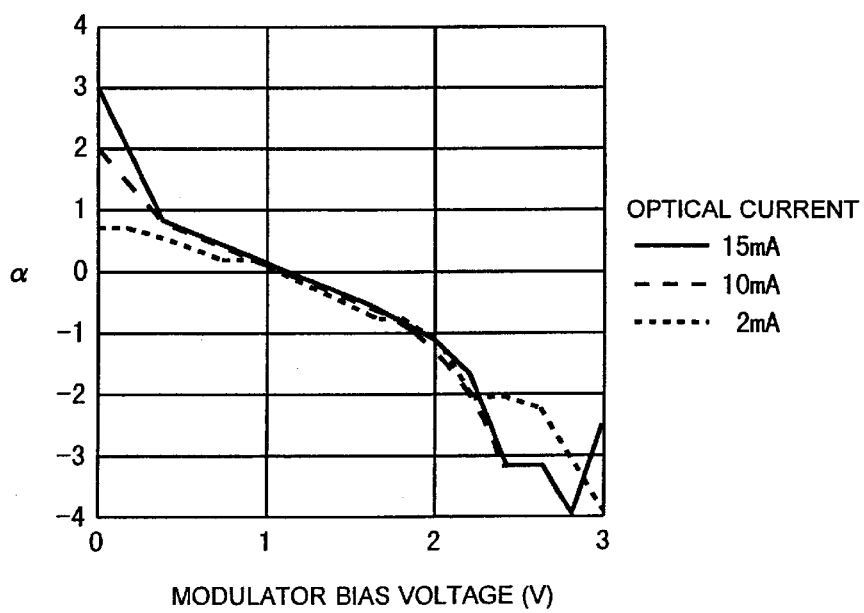
FIG. 2 is a graph for describing a chirp characteristic of a related-art optical modulator.

The energy band of the multi-quantum-well absorption layer 12 can be represented as shown in FIG. 1, as in the case of the multi-quantum-well absorption layer provided in the related-art optical modulator. The configuration and operation of the optical modulator 10 will be described by reference to FIG. 1 in conjunction with FIG. 3.

FIG. 4 is a table showing, for comparison, characteristic values of the multi-quantum-well absorption layer of the relate-art common optical modulator, characteristic values of the multi-quantum-well absorption layer according to the first embodiment, and characteristic values of the multi-quantum-well absorption layer according to a second embodiment to be described later. Egb, $\Delta Ec$ and $\Delta Ev$ shown in FIG. 4 denote a bandgap of the barrier layer, a band offset of a conduction band and a band offset of a valence band shown in FIG. 1, respectively. Details of barrier distortion shown in FIG. 4 will be described later.

In the example shown in FIG. 4, the barrier layer of the related-art multi-quantum-well absorption layer has a bandgap Egb of 1.051 eV. In accordance with the value of Egb, the band offset $\Delta Ec$ of the conduction band and the band offset $\Delta Ev$ of the valence band assume values of 96 meV and 129 meV, respectively, in the related-art multi-quantum-well absorption layer.

In contrast, in the first embodiment, the bandgap Egb of the barrier layer is reduced to 0.939 eV. Consequently, the band offset $\Delta Ec$ of the conduction band is reduced to a value of 52 meV, and the band offset $\Delta Ev$ of the valence band is reduced to a value of 72 mV.

In the optical modulator, when the well layer absorbs light, an electron-hole pair is generated. Of the electron-hole pair, the hole is left in the valence band. When the hole is accumulated in the well layer, a change arises in the refractive index of the multi-quantum-well absorption layer 12, whereby a chirp of the optical modulator is increased. As mentioned above, the band offset $\Delta Ev$ of the valence band is suppressed to a value smaller than that of the valence band in the related-art multi-quantum-well absorption layer. The smaller the band offset $\Delta Ev$, the more apt the hole remaining in the valence band of the well layer is to be wiped off from the well layer. Therefore, the smaller the band gap $\Delta Ev$, the hole is less likely to be accumulated in the well layer. In contrast with the related-art optical modulator, the optical modulator according to the first embodiment can suppress changes in the refractive index of the multi-quantum-well absorption layer stemming from accumulation of holes. Consequently, chirp can be diminished.

Figure 5:
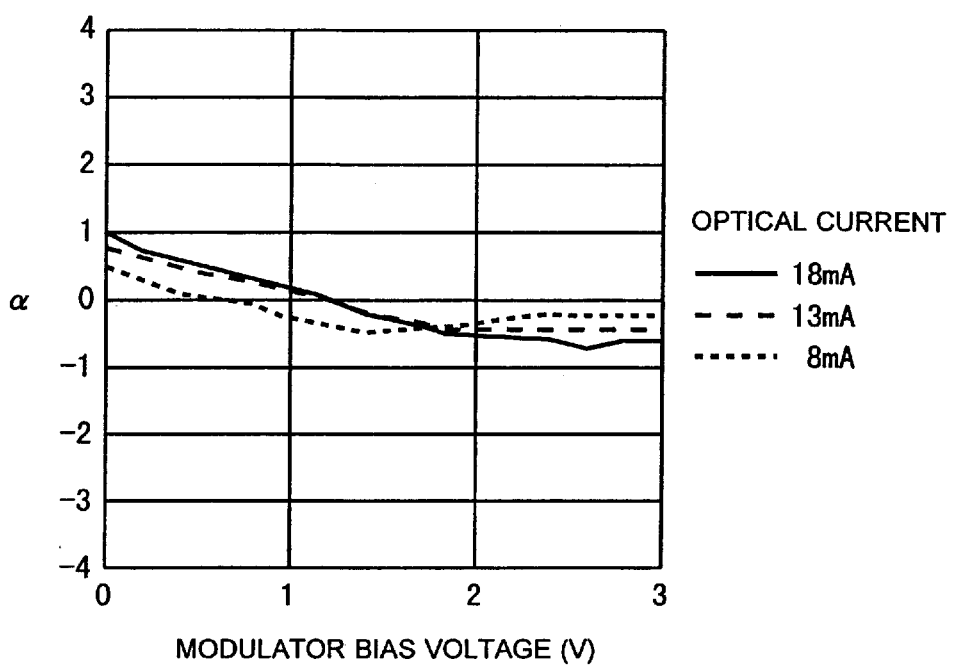
FIG. 5 is a graph for describing chirp-related characteristics of the optical modulator according to the first embodiment of the invention.

FIG. 5 is a graph for describing chirp-related characteristics of the optical modulator according to the first embodiment of the invention. In FIG. 5, the horizontal axis represents a modulator bias voltage to be applied to an optical modulator, and the vertical axis represents an $\alpha$ parameter representing the level of chirp. Three types of lines shown in FIG. 5 respectively represent the $\alpha$ parameter obtained as a result of incident light which induces an optical current of 18 mA, the $\alpha$ parameter obtained as a result of incident light which induces an optical current of 13 mA, and the $\alpha$ parameter obtained as a result of incident light which induces an optical current of 8 mA. The value of the optical current is proportional to the intensity of the incident light entering the optical modulator 10 and the number of photons absorbed by the multi-quantum-well absorption layer 12.

As shown in FIG. 5, the $\alpha$ parameter of the optical modulator according to the first embodiment is not greatly influenced by the value of the optical current. When the modulator bias voltage is 0, the $\alpha$ parameter assumes a value of smaller than 1 for all optical currents of equal to or less than 18 mV. For this reason, in contrast with the related-art optical modulator, the optical modulator 10 according to the present embodiment can simultaneously satisfy demand for increased intensity of incident light and demand for reduced chirp.

Figure 6:
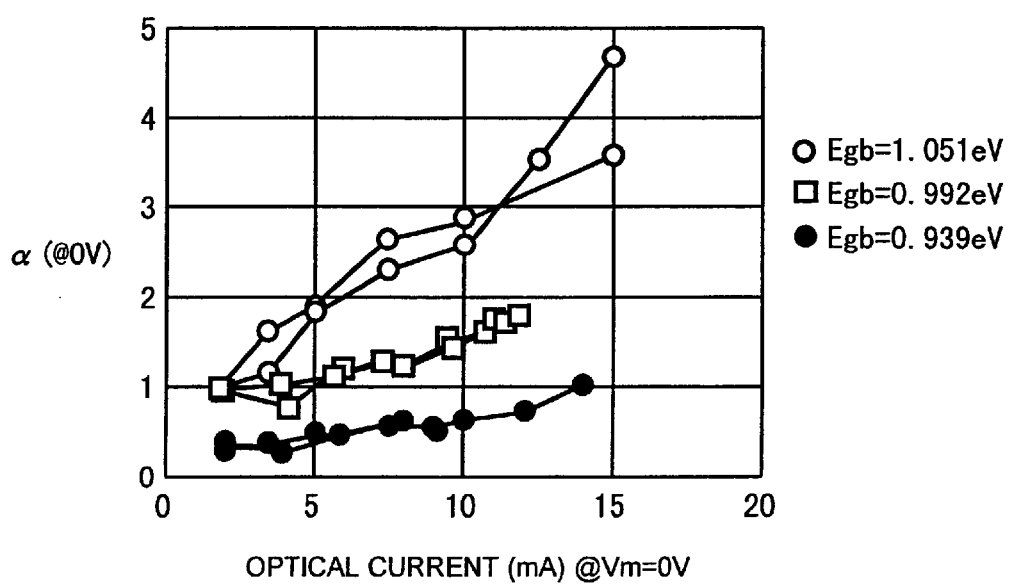
FIG. 6 is a graph showing correlation between a chirp of an optical modulator and a bandgap Egb of a barrier layer.

FIG. 6 is a graph showing correlation between the chirp of the optical modulator and the bandgap Egb of the barrier layer. In FIG. 6, the vertical axis represents the value of an α parameter when the modulator bias voltage assumes a value of 0, and the horizontal axis represents the value of an optical current developed in the optical modulator. In FIG. 6, a line with outlined circles represents the value of the α parameter obtained when the bandgap Egb assumes a value of 1.051 eV (the result of the related-art optical modulator). A line with solid circles represents the value of the α parameter obtained when the bandgap Egb assumes a value of 0.939 eV (the result of the optical modulator according to the first embodiment). A line with outlined squares represents the value of the α parameter obtained when the bandgap Egb assumes a value of 0.992 eV (i.e., a reference result). These results definitely show that the smaller the bandgap of the barrier layer, the greater the diminishment of the α parameter.

In the first embodiment, in order to impart to the optical modulator 10 the performance required for the light source of the optical communications system, the bandgap Egb of the barrier layer is set to a value of 0.939 eV. However, the bandgap Egb is not limited to this value; the performance of the light source of the optical communications system can be satisfied by means of setting the bandgap Egb of the barrier layer to a value that is equal to or less than 0.946 eV but sufficiently greater than the bandgap of the well layer.

Figure 7:
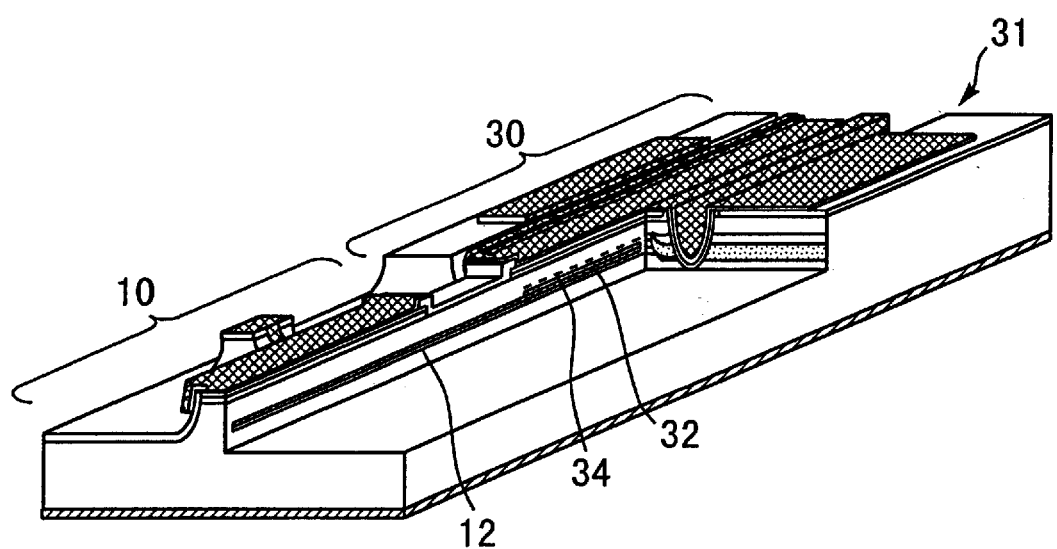
FIG. 7 is a perspective view showing an optical modulator integrated laser diode provided with the optical modulator according to the first or second embodiment.

FIG. 7 is a perspective view showing an optical modulator integrated laser diode 31 integrally comprising the optical modulator 10 according to the first embodiment and the laser diode 30. The laser diode 31 is equipped with an active layer 32 and a diffraction grating 34 for supplying a laser beam, as incident light, to the multi-quantum-well absorption layer 12 of the modulator 10. The optical modulator integrated laser diode 31 shown in FIG. 7 enables accurate modulation of high-intensity laser light produced by the laser diode 30, through use of the optical modulator 10 involving less severe chirp, thereby enabling generation of an optical communications signal of high intensity and accuracy.

Second Embodiment

A second embodiment of the present invention will now be described by reference to FIGS. 8 through 11.

An optical modulator according to the second embodiment is identical in configuration with that described in connection with the first embodiment, except that the multi-quantum-well absorption layer 12 assumes characteristic values differing from those of the multi-quantum-well absorption layer 12 in the first embodiment. In the present embodiment, the multi-quantum-well absorption layer 12 has the characteristic values described in the row for the second embodiment shown in FIG. 4.

A semiconductor crystal constituting an optical device has a crystal size, i.e., a lattice constant which corresponds to the material and composition thereof. Such a crystal assumes a cubic shape whose length of each side is equal to a lattice constant when being present in a free space. However, when the crystal epitaxially grows on a substrate, extension or contraction distortion arises in the crystal in accordance with the relationship between the lattice constant of a growing crystal and the lattice constant of the substrate.

Figure 8A:
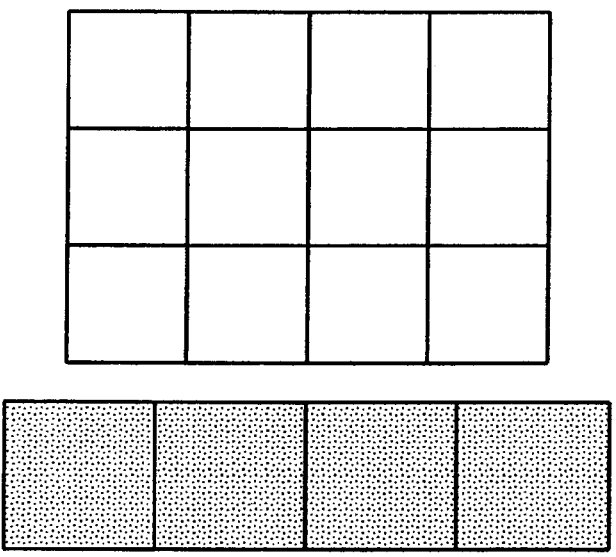
FIGS. 8A and 8B are figures for describing an extension distortion arising in a semiconductor crystal.
Figure 8B:
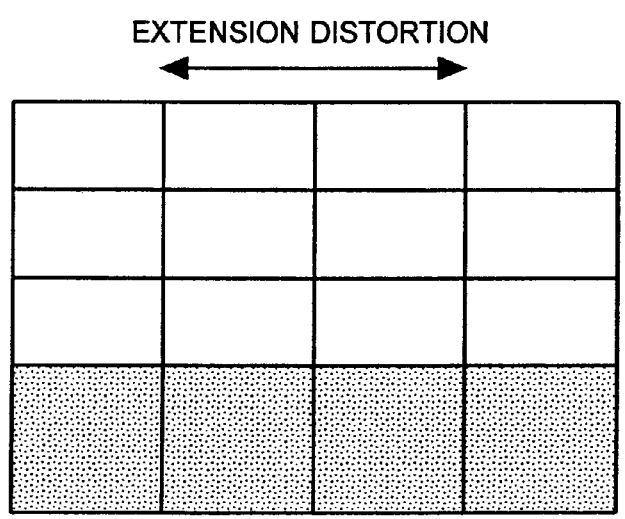

FIG. 8A shows a case where the lattice constant of the epitaxially-growing crystal is smaller than the lattice constant of the substrate. In this case, when a layer of that crystal is formed on the substrate by means of epitaxial growth, extension distortion is developed in the crystal layer, as shown in FIG. 8B. It is be noted that if the distortion arisen in the crystal is, for example, about 5%, the extension distortion is by convention expressed as "distortion of −5%" using a minus symbol.

Figure 9A:
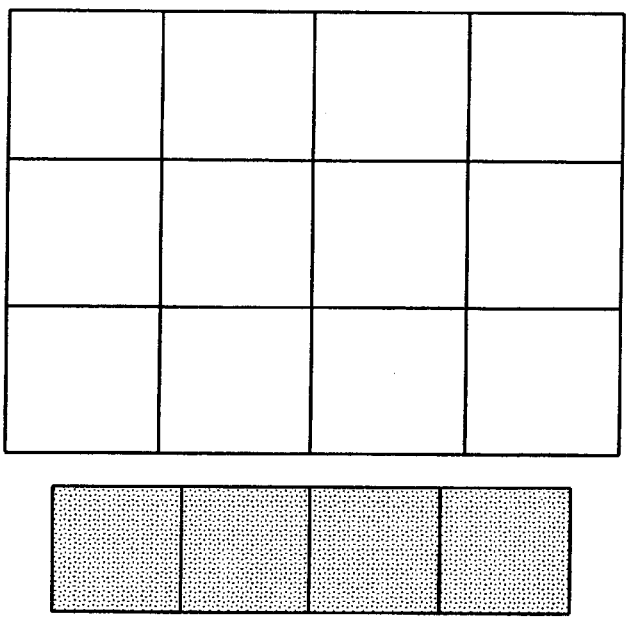
FIGS. 9A and 9B are figures for describing a contraction distortion arising in a semiconductor crystal.
Figure 9B:
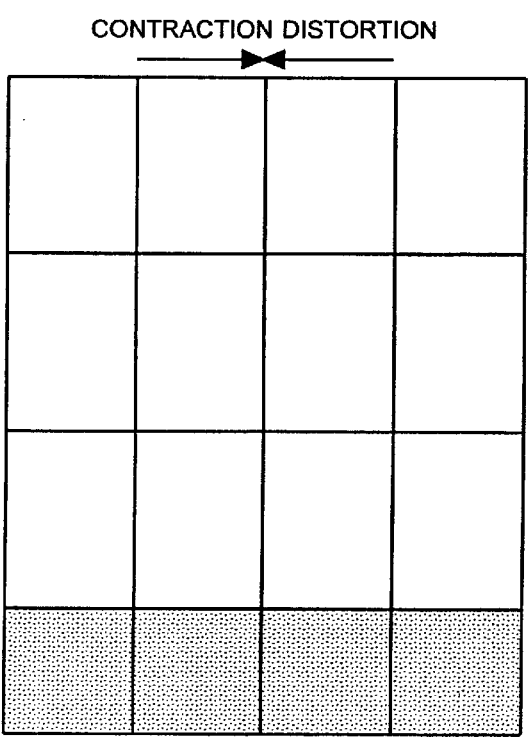

FIG. 9A shows a case where the lattice constant of the epitaxially-growing crystal is greater than that of the substrate. In this case, when the crystal layer is formed on a substrate by means of the epitaxial growth technique, contraction distortion arises in the crystal layer, as shown in FIG. 9B. It is be noted that if the distortion arisen in the crystal is, for example, about 5%, the contraction distortion is by convention expressed as "distortion of +5%" using a plus symbol.

As shown in FIG. 4, the related-art multi-quantum-well absorption layer and the multi-quantum-well absorption layer are formed such that a barrier layer assumes extension distortion of 0.3%. In contrast, the multi-quantum-well absorption layer 12 according to the second embodiment is formed such that a barrier layer assumes extension distortion of 0.6%.

As a result of extension distortion of 0.6% being imparted to the barrier layer of the multi-quantum-well absorption layer 12 in the manner as mentioned above, the band offset ΔEc of the conduction band according to the second embodiment assumes a value of 60 meV. Further, the band offset ΔEv of the valence band assumes a value of 63 meV. In short, the band offset ΔEv of the valence band is smaller than that obtained in the first embodiment. Further, the band offset ΔEv of the valence band is substantially the same as the band offset ΔEc of the conduction band. The multi-quantum-well absorption layer 12 having the foregoing characteristic values enables an extinction ratio higher than that described in the first embodiment while suppressing the chirp as in the first embodiment, as shown in FIGS. 10 and 11.

Figure 10:
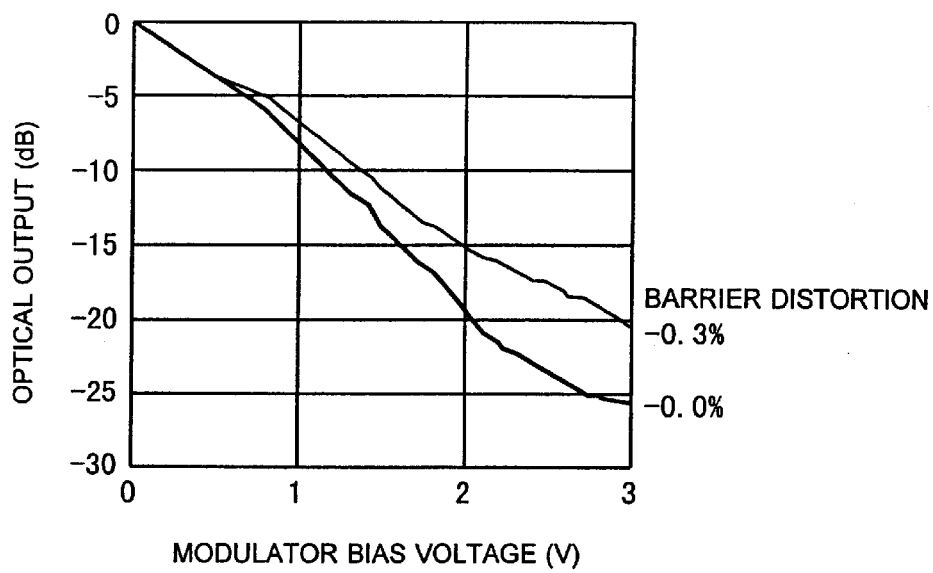
FIG. 10 is a graph showing a correlation between an extension distortion in a barrier layer and an extinction ratio of an optical modulator.

FIG. 10 shows, for comparison, an extinction characteristic of the optical modulator according to the first embodiment (indicated by narrow lines shown in the drawing) and an extinction characteristic of the optical modulator according to the second embodiment (indicated by solid lines shown in the drawing). As shown in FIG. 10, when the modulator bias voltage is increased from 0V to 2V, the resultant extinction ratio assumes a value of 15 dB in the first embodiment, and the extinction ratio to be obtained in the second embodiment is improved to 20 dB.

Figure 11:
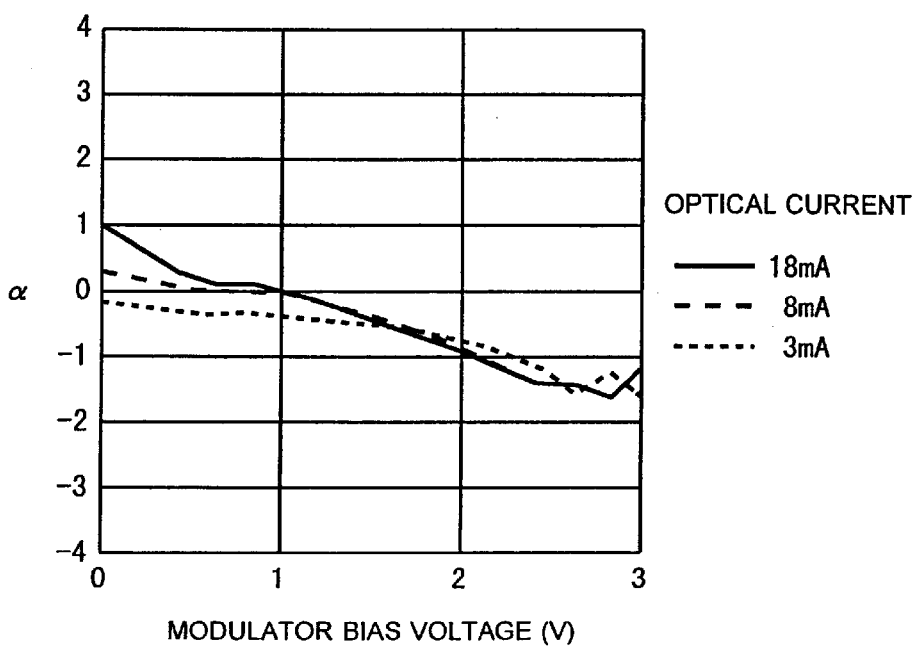
FIG. 11 is a graph showing a chirp-related characteristic of the optical modulator according to the second embodiment.

FIG. 11 is a graph for describing the chirp-related characteristics of the optical modulator according to the second embodiment. In FIG. 11, the horizontal axis represents a modulator bias voltage to be applied to an optical modulator, and the vertical axis represents an α parameter representing the level of chirp. Three types of lines shown in FIG. 11 respectively represent the α parameter obtained as a result of incident light which induces an optical current of 18 mA, the α parameter obtained as a result of incident light which induces an optical current of 8 mA, and the α parameter obtained as a result of incident light which induces an optical current of 3 mA.

As shown in FIG. 11, the α parameter of the optical modulator according to the second embodiment is not greatly influenced by the value of the optical current. When the modulator bias voltage is 0, the α parameter assumes a value of smaller than 1 for all optical currents of 18 mV or less, as in the case of the first embodiment. As mentioned above, the optical modulator 10 according to the second embodiment ensures the same superior chirp characteristics as those of the optical modulator according to the first embodiment, thus achieving a superior extinction ratio characteristic.

In the second embodiment, 0.6% extension distortion is imparted to the barrier layer for improving the extinction ratio characteristic. However, the extension distortion to be imparted to the barrier layer is not limited to such a value; by means of imparting 0.5% or more extension distortion to the barrier layer, the extinction ratio characteristic of the optical modulator can be improved to a practically useful level. As in the case of the first embodiment, when the optical modulator 10 according to the second embodiment is used in combination with the laser diode 30, the optical modulator integrated laser diode 31 shown in FIG. 7 is embodied.

The present invention is embodied in the manner as mentioned above and hence yields the following advantages.

According to a first aspect of the present invention, by means of setting the bandgap of the barrier layer of the multi-quantum-well absorption layer to an appropriate level, the band offset of the valence band can be reduced to a smaller value while an appropriate energy barrier wall is ensured on either side of the well layer. Hence, the present invention enables implementation of an optical modulator which exhibits lower chirp in response to incident light of high intensity.

According to a second aspect of the present invention, by means of forming the well layer and the barrier layer of the multi-quantum-well absorption layer from appropriate material, an optical modulator suitable for use as a light source of optical communication can be materialized.

According to a third aspect of the present invention, by means of imparting appropriate extension distortion to the barrier layer, there can be embodied an optical modulator having a high extinction ratio while chirp is suppressed to a low level.

According to a fourth aspect of the present invention, by means of combining an optical modulator capable of suppressing chirp to a lower level for incident light of high intensity and a laser diode, there can be materialized an optical modulator integrated laser diode which yields a high-power and highly-accurate optical communication signal.

Further, the present invention is not limited to these embodiments, but variations and modifications may be made without departing from the scope of the present invention.

The entire disclosure of Japanese Patent Application No. 2000-347483 filed on Nov. 15, 2000 including specification, claims, drawings and summary are incorporated herein by reference in its entirety.

What is claimed is:

1. An optical modulator including an absorption layer having a multiple quantum well structure, wherein the absorption layer comprises:

a plurality of well layers having a first bandgap energy; and a plurality of barrier layers having a second bandgap energy, the second bandgap energy being larger than the first bandgap energy and no more than 0.946 eV.

2. The optical modulator according to claim 1, wherein the second bandgap energy is no more than 0.939 eV.

3. The optical modulator according to claim 1, wherein the well layers are selected from the group consisting of InGaAsP and InGaAs, and the barrier layers are selected from the group consisting of InGaAsP, InAlAs, and InGaAlAs.

4. The optical modulator according to claim 1, wherein the barrier layer has an extension distortion of at least 0.5%.

5. The optical modulator according to claim 4, wherein the barrier layer has an extension distortion of at least 0.6%.

6. An optical modulator with an integrated laser diode comprising:

an optical modulator including an absorption layer having a multiple quantum well structure, wherein the absorption layer comprises a plurality of well layers having a first bandgap energy; and a plurality of barrier layers having a second bandgap energy, the second bandgap energy being larger than the first bandgap energy and no more than 0.946 eV; and a laser diode producing a laser beam entering the absorption layer of the optical modulator.

7. The optical modulator according to claim 1, wherein the well layers and the barriers layers are III–V semiconductor materials.

8. The optical modulator according to claim 6, wherein the well layers and the barriers layers are III–V semiconductor materials.

* * * * *